United States Patent [19]

Nakahashi et al.

[11] Patent Number: 4,914,439

[45] Date of Patent: Apr. 3, 1990

[54] ANALOG TO DIGITAL CONVERSION SYSTEM UTILIZING DITHER

[75] Inventors: Teruyoshi Nakahashi, Iruma; Tetsuji Ono, Musashino, both of Japan

[73] Assignee: Teac Corporation, Tokyo, Japan

[21] Appl. No.: 242,366

[22] Filed: Sep. 9, 1988

[30] Foreign Application Priority Data

Sep. 14, 1987 [JP] Japan ................... 62-230788

[51] Int. Cl.$^4$ ........................................... H03M 1/20
[52] U.S. Cl. ..................................... 341/131; 341/161
[58] Field of Search ................... 341/131, 161, 162

[56] References Cited

U.S. PATENT DOCUMENTS

| | | | |
|---|---|---|---|
| 4,644,324 | 2/1987 | Araki et al. | 341/131 |
| 4,700,173 | 10/1987 | Araki et al. | 341/122 |
| 4,751,496 | 6/1988 | Araki et al. | 341/131 |
| 4,761,634 | 8/1988 | Yamaguchi et al. | 341/131 |
| 4,812,846 | 3/1989 | Noro | 341/131 |

*Primary Examiner*—William M. Shoop, Jr.
*Assistant Examiner*—Gary J. Romano
*Attorney, Agent, or Firm*—Woodcock Washburn Kurtz Mackiewicz & Norris

[57] ABSTRACT

A system suitable for digitizing an analog audio signal, with the addition of analog dither to the audio signal and, after the digitization of the resulting analog audio/dither signal, the subtraction of digital dither from the digital audio/dither signal. For the production of the analog and digital dither signals, a digital dither generator is employed which generates digital dither of, e.g., 16 bits. The analog dither signal is derived from this 16 bits dither by first translating the same into analog dither of equivalent magnitude and then by reducing its magnitude to a value equivalent to e.g., 10 bits. The digital dither signal, on the other hand, is provided by reducing the magnitude of the 16 bits digital dither to that of substantially 10 bits. The analog dither signal is added to the audio signal, and the resulting analog audio/dither signal is translated by an analog to digital converter of, e.g., 16 bits into a digital audio/dither signal. Then the substantially 10 bits digital dither signal is subtracted from the digital audio/dither signal. A limiter may be connected to the output of the subtracter for limiting the output level when the analog to digital converter is overloaded.

8 Claims, 2 Drawing Sheets

ANALOG TO DIGITAL CONVERSION SYSTEM UTILIZING DITHER

BACKGROUND OF THE INVENTION

Our invention relates to analog to digital (A-D) conversion systems, and more specifically to a system for digitizing an audio or like analog information signal, with the addition of analog dither (artificially created white noise signal) to the analog information signal and the subsequent removal of the dither from the digitized information signal for the reduction of noise and distortion. Still more specifically, our invention deals with such A-D conversion systems suitable for use in digital audio tape (DAT) systems, among other applications.

In the pulse code modulation (PCM) or digital processing of audio signals, one of the problems that must be overcome is so called "quantization noise", that is, the noise arising from the differences between the samples of the music wave and the quantized values of the samples. The quantization noise becomes particularly pronounced, distorting the input audio signal as higher harmonics, when the input signal is of low amplitude and so requires a relatively small number of quantization steps. Even when the input signal level is comparatively high, the quantization noise will manifest itself if the signal level changes very slowly. Additionally, the analog to digital converter (ADC) itself, which is incorporated in the A-D conversion system, tends to introduce nonlinear distortion during the digitization of the audio signal.

We are aware that dither has been used conventionally for the solution of the above discussed problems. U.S. Pat. No. 4,751,496, issued to Araki et al. and assigned to the assignee of our present application, discloses an example of A-D conversion system utilizing dither, with emphasis on how to prevent the overloading of the ADC when the audio signal to be digitized is of large amplitude.

Generally, analog dither is superposed on the audio signal prior to its A-D conversion and, following the conversion, is removed from the digitized audio signal. The removal of the dither component from the digitized audio signal requires the preparation of digital dither equivalent to the analog dither that has been added to the audio signal. The dither component is removed as the digitized audio signal and the digital dither are both directed into a subtracter.

SUMMARY OF THE INVENTION

We have hereby invented, in A-D conversion systems of the type defined, how to generate analog and digital dither signals in exact agreement with each other, thereby assuring complete removal of the dither component from the digitized information signal. We have also solved how to effectively avoid the waveshape distortion and noise porduction due to the overloading of the ADC when the input signal level is high.

Briefly, our invention may be summarized as an A-D conversion system comprising a digital dither generator for generating a first digital dither signal of m bits. For the provision of analog dither to be added to analog information signal, a digital to analog converter is connected to the digital dither generator for translating the first digital dither signal of m bits into a first analog dither signal of equivalent magnitude. Then the first analog dither signal is reduced in magnitude to provide a second analog dither signal equivalent in magnitude to a digital dither signal of 1 bits, where 1 is less than m. This second analog dither signal is added to the analog information signal to provide an analog information/dither signal. An ADC subsequently converts the analog information/dither signal into a digital information/dither signal of n bits, where n is equal, or not equal, to m and greater than 1.

On the other hand, for the provision of digital dither to be subtracted from the digital information/dither signal, a digital level reduction circuit is connected to the digital dither generator for translating the first digital dither signal of m bits into a second digital dither signal of substantially 1 bits. The 1 bits of the second digital dither signal are composed of the 1 consecutive bits, including the most significant bit, of the first digital dither signal. A subtractor is connected to both the analog to digital converter and the digital level reduction circuit for subtracting the second digital dither signal from the digital information/dither signal and providing a digital information signal.

In a preferred embodiment, m and n are both 16, and 1 is 10. Thus the digital dither generator generates the first digital dither signal of 16 bits. This 16 bits first digital dither signal is subsequently translated into the first analog signal of equivalent magnitude, and the first analog signal is reduced in level to provide the second analog dither signal equivalent in magnitude to 10 bits digital dither. The second digital dither signal, on the other hand, is composed of 10 consecutive bits, including the most significant one, of the 16 bits first digital dither signal.

Thus, even though essentially 10 bits digital dither is required for the removal of the dither component from the digitized information/dither signal, a 16 bits digital dither generator is employed for greater coincidence between the second analog dither signal to be added to the analog information signal and the second digital dither signal to be subtracted from the digital information/dither signal. It will therefore be seen that dither can be removed from the digitized information signal to a greater degree than heretofore.

Our invention also features a digital limiter and an overload detector circuit which are both connected to the output of the subtractor. The information/dither signal may overload the ADC when the incoming information signal level is too high, with the result that the digital information signal contains dither to the detriment of high fidelity sound recording. Such overloading of the ADC is detected by the overload detector circuit, and the limiter responds to such detection by cutting off the dither component from the digital information signal.

The above and other features and advantages of our invention and the manner of realizing them will become more apparent, and the invention itself will best be understood, from the study of the following description and appended claims, with reference had to the attached drawings showing the preferred embodiment of our invention.

DESCRIPTION OF THE PREFERRED EMBODIMENT

Figure 1:
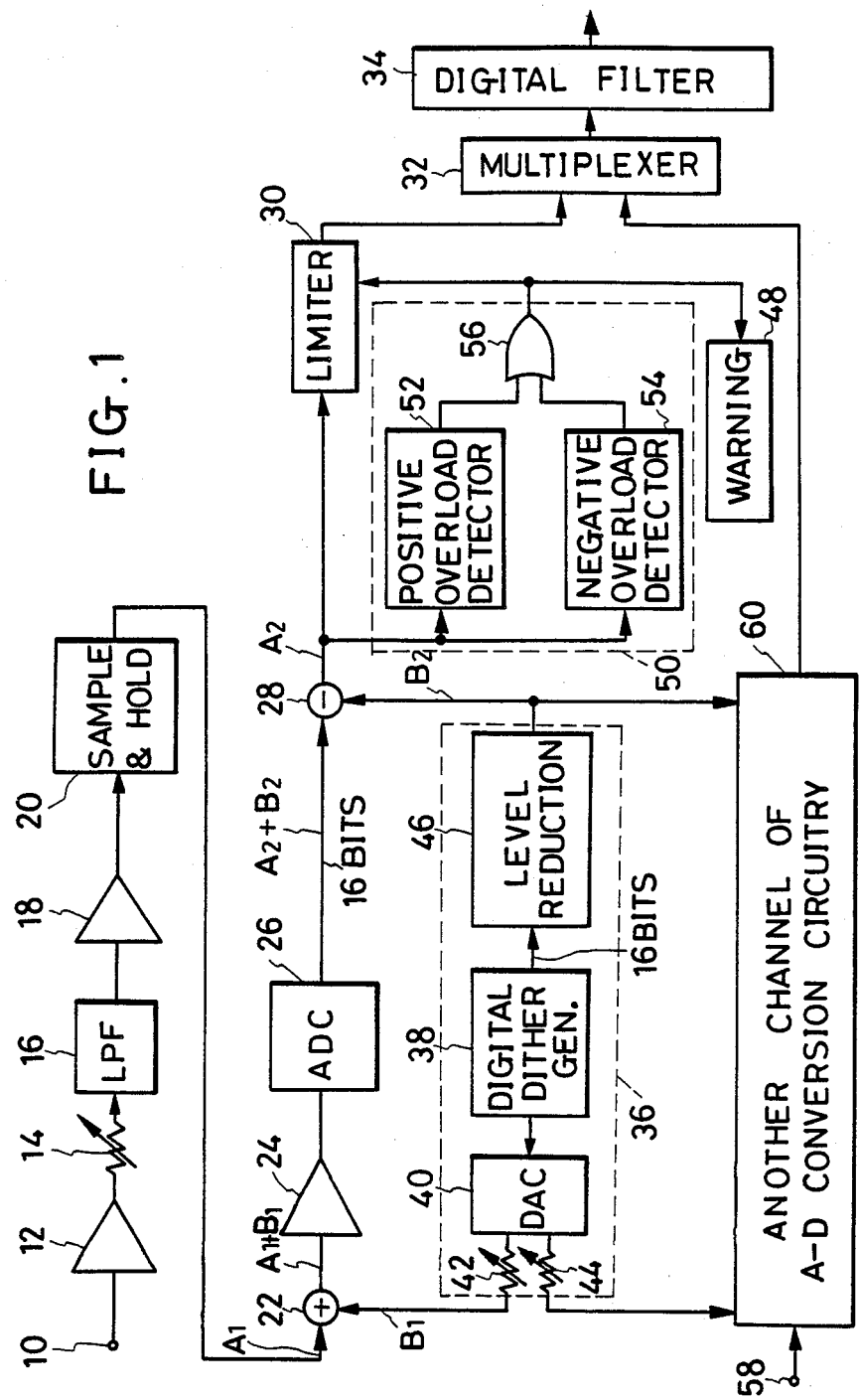
FIG. 1 is a block diagram of the A-D convension system embodying the novel concepts of out invention, the system being shown as adapted for digitizing stereophonic audio signals in a DAT system.

We will now describe our invention in detail as adapted for digitizing an analog audio signal on a PCM scheme in an environment of a DAT recording system. As illustrated in FIG. 1, the exemplified A-D conversion system in accordance with our invention comprises an input terminal 10 for inputing an analog audio (information) signal to be digitized, a first amplifier 12, an input level control 14 in the form of a variable resistor, a low pass filter (LPF) 16, a second amplifier 18, a sample and hold circuit 20, a dither adder 22, a buffer amplifier 24, an ADC 26, a dither subtracter 28, a limiter 30, a multiplexer 32, and a digital filter 34, which are all serially connected in that order.

The LPF 16 passes the audio frequency range (typically from zero to 20 kHz) of the incoming analog audio signal. The sample and hold circuit 20 samples the analog audio signal at a prescribed frequency of, say, 88.2 kHz and holds each sample until the next sample is obtained. The output of the sample and hold circuit 20 is connected to one of the two inputs of the dither adder 22. The positive and negative peaks of the analog audio signal A1, fed from sample and hold circuit 20 to adder 22, are within plus and minus approximately 3 V in this embodiment.

Connected to the other input of the dither adder 22, a dither generator circuit 36 is intended to provide both analog dither B1 to be added to the analog audio signal A1 and digital dither B2 to be subtracted from the digitized audio signal. The dither generator circuit 36 comprises a digital dither generator 38, a digital to analog converter (DAC) 40, analog level reduction means such as variable resistors 42 and 44, and a digital level reduction circuit 46. The digital dither generator 38 and the DAC 40 are both of 16 bits construction in this embodiment. In practice the digital dither generator 38 can take the form of a maximal length pulse sequence pseudorandom pulse generator capable of generating a 16 bits digital dither signal at the same sampling frequency as that of the sample and hold circuit 20. The substantially random digital dither signal put out by this generator 38 is essentially equivalent to white noise. The generator 38 delivers the 16 bits digital dither signal both to the DAC 40 and to the level reduction circuit 46.

Figure 3:
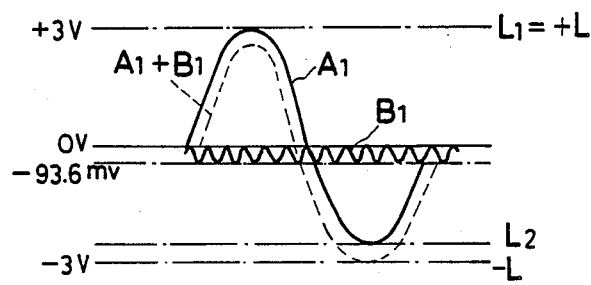
FIG. 3 is a waveform diagram explanatory of how the overloading of the ADC in the FIG. 1 system is detected when the analog dither signal to be added to the audio signal is of negative polarity.

For the provision of the analog dither signal B1 the 16 bits digital dither signal from the generator 38 is first translated by the DAC 40 into an analog dither signal of equivalent magnitude. Then the analog dither output from the DAC 40 has its magnitude reduced by the variable resistor 42 to such an extent that the resulting analog dither signal B1 is equivalent in magnitude to a 10 bits digital dither signal. As indicated in FIG. 3, the opposite peaks of the reduced magnitude analog dither signal B1 are, typically, at 0 V and −93.6 mV, respectively. It is to be understood that, in this and other waveform diagrams hereinafter referred to, we have greatly simplified the waveshapes for illustrative convenience. This analog dither signal B1 is fed to the adder 22.

Thus the adder 22 combines the analog audio signal A1 and analog dither signal B1 to provide an analog audio/dither (information/dither) signal (A1+B1) shown also in FIG. 3. The analog audio/dither signal (A1+B1) has an amplitude that is proportional to the sum of the analog audio signal A1 and analog dither signal B1. After being amplified by the buffer amplifier 24, the analog audio/dither signal (A1+B1) is directed into the ADC 26 thereby to be digitized.

The capacity (maximum allowable range of input voltages) of the ADC 26 is from −3 V to +3 V in this embodiment. The output from the ADC 26 is a 16 bits digital audio/dither signal (A2+B2) corresponding to the input analog audio/dither signal (A1+B1). Possibly, the ADC 26 might give rise to nonlinear distortion due to variations in quantization steps. Actually, however, the nonlinear distortion of its output will be reduced to a minimum owing to the addition of dither. The digital audio/dither signal (A2+B2) is directed to one input of the dither subtracter 28.

The other input of the dither subtracter 28 is connected to the level reduction circuit 46 of the dither generator circuit 36 for inputting the digital dither signal B2 therefrom. Since the analog dither signal B1 which has been added to the analog audio signal A1 is equivalent in magnitude to 10 bits digital dither, the digital dither signal B2 can be of substantially 10 bits. The dither subtracter 28 subtracts the substantially 10 bits digital dither signal B2 from the 16 bits digital audio/dither signal (A2+B2) and, theoretically, puts out only the digitized audio signal A2.

We will now explain how the level reduction circuit 46 derives the substantially 10 bits digital signal B2 from the 16 bits digital dither signal generated by the dither generator 38. We suggest the use of a D flip flop as the level reduction circuit 46. Let us suppose that the 16 bits digital dither signal put out by the dither generator 38 contains the following set of digits of positive polarity:

"0101101100101110".

Then the level reduction circuit 46 will delete the six less significant bits "101110", from the eleventh significant bit to the least significant bit, of the input word and will place six 0's in the higher bit positions of the 10 remaining bits "0101101100". Thus the corresponding output from the level reduction circuit 46 will be:

"0000000101101100".

It will be seen that the 10 more significant bits "0101101100", from the most significant bit to the tenth significant bit, of the input word have been shifted to the 10 less significant bit positions of the output word of the level reduction circuit 46 and are preceded by six 0's, Let us further assume that the 16 bits digital dither signal fed from the dither generator 38 to the level reduction circuit 46 contains the following set of digits of negative polarity:

"1011100111001001".

Then the level reduction circuit 46 will cut off the six less significant bits "001001" of the input word and will place six 1's in the higher bit positions of the 10 remaining bits "1011100111". Therefore the resulting output from the level reduction circuit 46 will be:

"1111111011100111".

Thus, in this case, too, the 10 more significant bits "1011100111", from the most significant bit to the tenth significant bits, of the input word have been shifted to the 10 less significant bit positions of the output word. The only difference is that the shifted 10 bits are preceded by six 1's in the output word.

It will therefore be understood that the digital dither signal B2, fed from the level reduction circuit 46 to the subtracter 28, is of 16 bits in form but can be thought of as being virtually of 10 bits because only the 10 less significant bits of the words are subject to change.

It will also be appreciated that the digital dither singal B2 directed to the subtracter 28 is derived from the same source as the analog dither signal B1 added to the analog audio signal A1 by the adder 22. What is more important, the 10 variable bits of the digital dither signal B2 are taken from the 10 more significant bits of the 16 bits digital dither put out by the dither generator 38. These 10 more significant bits of the dither generator output are more faithfully represented by the analog dither signal B1. At least theoretically, therefore, the dither component of the digital audio/dither signal (A2+B2) can be thoroughly removed by the subtracter 28.

Generally, dither removal from the digitized audio/-dither signal might not be of absolute necessity in cases where the dither level is extremely low. However, when the dither level is relatively high as in this embodiment of our invention, the dither will manifest itself as audible noise in the reproduction of the audio signal if left unremoved from the digitized audio/dither signal.

The addition of the analog dither signal B1 to the audio signal A1 and the subsequent removal of the dither component B2 from the digitized audio/dither signal (A2+B2) will provide the full benefits of this technology if the magnitude of the analog audio/dither signal (A1+B1) is within the capacity (plus and minus 3 V) of the ADC 26. In practice, however, the analog audio/dither signal (A1+B1) may overload the ADC 26. We will now explain how this A-D conversion system operates to overcome the resulting inconveniences when the analog audio/dither signal overloads the ADC 26.

Figure 2:
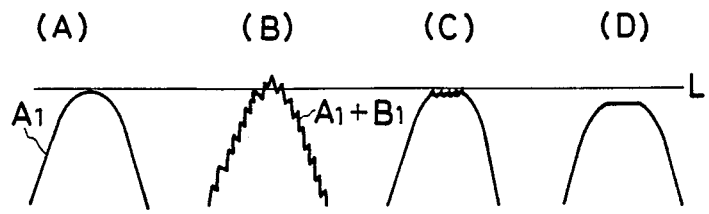
FIG. 2, consisting of (A) through (D), is a series of waveform diagrams explanatory of a problem arising upon addition of analog dither to an audio signal when its amplitude is high, and of how the problem is solved in the A-D conversion system of FIG. 1.

As drawn at (A) in FIG. 2, the analog signal A1 to be digitized may have a peak value equal to the overload level L of the ADC 26. An addition of the analog dither signal B1 to the analog audio signal A1 will result in the analog audio/dither signal (A1+B1), FIG. 2(B), that has a magnitude in excess of the overload level L of the ADC 26. Being incapable of digitizing input values exceeding its capacity, the ADC 26 will cut off such excess values. Upon subsequent subtraction, by the subtracter 28, of the digital dither signal B2 from the digitized audio/dither signal (A2+B2) put out by the ADC 26, the resulting output from the subtracter will contain dither, as depicted in FIG. 2(C) in terms of an analog equivalent. This dither component, if not removed from the digitized audio signal A2, would be reproduced as audible noise.

We have connected the output of the subtracter 28 to the limiter 30 in order to eliminate the possible dither component from the digitized audio signal A2 as in FIG. 2(D). Preferably, and as shown in FIG. 1, a suitable warning device 48 may be coupled to the limiter 30 for warning the user that the input level of the audio signal being recorded is too high.

We have further employed an overload detector circuit 50 for actuating both the limiter 30 and the warning device 48. The overload detector circuit 50 comprises a positive overload detector circuit 52, a negative overload detector circuit 54, and an OR gate 56. Both positive and negative overload detector circuits 52 and 54 have their inputs connected to the subtracter 28, and their outputs to the OR gate 56. The output of this OR gate is connected to both the limiter 30 and the warning device 48.

As has been set forth with reference to FIG. 3, the analog dither signal B1 to be added to the analog audio signal A1 varies in magnitude between 0 V and −93.6 mV in this embodiment. Accordingly, upon addition of this analog dither signal B1 to the analog audio signal A1 shown in FIG. 3, one of the two envelopes of the resulting analog audio/dither signal (A1+B1) will coincide with the analog audio signal A1 whereas the other envelope will be as indicated by the dashed line in the same figure. It will therefore be understood that the positive peak value of the analog audio/dither signal (A1+B1) does not exceed the positive overload level +L of the ADC 26, even though this signal (A1+B1) is the result of addition of the analog dither signal B1 to the analog audio signal A1 whose positive peak value equals the positive overload level of the ADC.

From the foregoing considerations we have set the detection level L1 of the positive overload detector circuit 52 equal to the positive overload level +L of the ADC 26. The ADC 29 puts out the digital audio/dither signal (A2+B2) in the form of two's complements. Accordingly, the maximum positive output of the ADC 29 is:

"0111111111111111".

The positive overload detector 52 is constructed to reverse only the most significant bit of the incoming digital signal, prior to delivery to an AND gate. Consequently, when the input signal of the positive overload detector circuit 52 is of the level L1, a high output will be produced for delivery to both the limiter 30 and the warning device 48. The input level of the analog audio signal should not be so high as to reach the detection level L1 of the positive overload detector circuit 52 because such high input level will distort the sound being recorded. When the input level is too high, the warning device 48 will warn, perhaps visually, the user of that fact in response to the output from the overload detector circuit 50. The user may then lower the input level by manipulating the level control 14.

We have also indicated in FIG. 3 the detection level L2 of the negative overload detector circuit 54. The absolute value of this detection level L2 of the negative overload detector circuit is set lower than the negative overload level −L of the ADC 26 by the dither amplitude of 93.6 mV. The negative overload level −L is, in this embodiment:

"1000000000000000".

The detection level L2 of the negative overload detector circuit 54 is higher than this negative overload level −L by 93.6 mV (approximately 0.14 dB). Digitally, the negative detection level L2 can be expressed as:

"100000XXXXXXXXXX".

where X stands for either 1 or 0.

The negative overload detector circuit 54 can also be comprised of logic circuitry. When the input signal coincides with the negative detection level L2, the circuit 54 will deliver a high output to both the limiter 30 and the warning device 48 via the OR gate 56.

We understand that, when actuated by the high output from the overload detector circuit 50 as a result of either positive or negative overloading of the ADC 26, the limiter 30 produces the value of the positive L1 or negative L2 detection level as long as the overloading continues. We have not illustrated the details of the limiter 30 because it can per se be of known construction. As the limiter 30 operates as above stated, the subtracter output such as shown in FIG>(C) is processed into the form seen in FIG. 2(D), with the consequent reduction of audible noise. However, when activated, the limiter 30 unavoidably introduces waveform distortions. It is therefore desirable that the input magnitude of the audio signal be adjusted by the level control 14 so as not to overload the ADC 26.

We have mentioned that the warning device 48 is actuated when the digital input signal of the overload detector circuit 50 reaches both the positive L1 and negative L2 detection levels. The reader's attention is invited to the fact that the warning device 48 gives a warning not when the input signal of the overload detector circuit 50 reaches the negative overload level −L of the ADC 26 but when the input signal reaches the negative detection level L2 which is lower than the negative overload level −L by the dither amplitude of 93.6 mV. Thus the warning device 48 will help the user adjust the input level more correctly.

DAT systems in general are stereophonic. In this embodiment of our invention, too, another input terminal 58 is shown provided for inputting another channel of audio signal which is to be digitized by an A-D conversion circuitry 60 similar to that set forth hereinbefore. The output lines of both channels of A-D conversion circuitry are connected to the multiplexer 32. The multiplexed digital audio signals of both channels are fed through the digital filter 34 to a recording circuit, not shown, which falls outside the scope of our invention.

Figure 4:
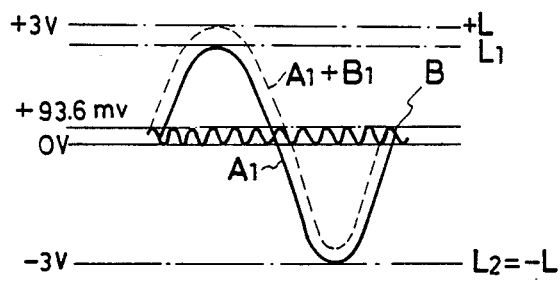
FIG. 4 is a diagram similar to FIG. 3 but explanatory of how the overloading of the ADC is detected when the analog dither signal is of positive polarity.

The embodiment so far described with reference to FIGS. 1-3 admits of a variety of modifications within the broad teaching hereof. For example, instead of employing the analog dither signal B1 of negative polarity, ranging in magnitude from 0 to −93.6 mV, there may be used an analog dither signal of positive polarity. FIG. 4 shows such a positive analog dither signal, varying in magnitude between 0 and +93.6 mV by way of example. In that case, as will be seen also from FIG. 4, the analog audio/dither signal (A1+B1) will be higher in level than the analog audio signal A1 to be digitized. The positive detection level L1 of the overload detector circuit 50 should therefore be set lower than the positive overload level +L of the ADC 26 by 93.6 mV or by approximately 0.14 dB. The negative detection level L2 can be set equal to the negative overload level −L of the ADC 26.

Figure 5:
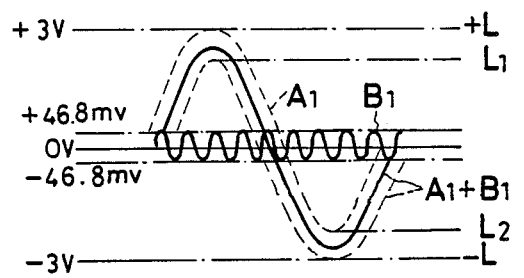
FIG. 5 is also a diagram similar to FIG. 3 but explanatory of how the overloading of the ADC is detected when the analog dither signal is of both polarities.

As another alternative, the analog dither signal B1 may take both positive and negative values. Thus, in FIG. 5, we have shown the analog dither signal B1 varying in magnitude between plus and minus 46.8 mV by way of example. This analog dither signal requires that the positive detection level L1 be less than the positive overload level +L, and that the negative detection level L2 be higher (lower in absolute value) than the negative overload level −L.

It is nevertheless preferable that the analog dither signal B1 be of only negative polarity as in FIG. 3 or of only positive polarity as in FIG. 4, because such dither of one polarity can reduce distortion when the analog audio signal A1 is of low amplitude. Take the negative dither signal B1 of FIG. 3 for example. When this dither signal B1 is added to the analog audio signal A1, the resulting audio/dither signal (A1+B1) will not pass through zero during the negative half cycles of the audio signal A1 if its amplitude is relatively small. However, during the positive half cycles of the audio signal A1, the audio/dither signal (A1+B1) may cross zero. Quantization may then take place on both positive and negative sides, with the consequent increase in quantization errors and, therefore, in signal distortion. Nonetheless, the possibility of the audio/dither signal (A1+B1) crossing the zero level according to the methods of FIGS. 3 and 4 is approximately half that according to the method of FIG. 5, so that the first two methods realize a substantial reduction of distortion.

Various other modifications or alterations of this disclosure will readily occur to one skilled in the art without departing from the scope of our invention.

What is claimed is:

1. An analog to digital conversion system comprising:
(a) input means for inputting an analog information signal (A1) to be digitized;
(b) a digital dither generator for generating a first digital dither signal of m bits;
(c) a digital to analog converter connected to the digital dither generator for translating the first digitial signal of m bits into a first analog dither signal of equivalent magnitude;
(d) analog level reduction means connected to the digital to analog converter for reducing the magnitude of the first analog dither signal and providing a second analog dither signal (B1) equivalent in magnitude to a digital dither signal of l bits, where l is less than m;
(e) an adder connected to both the input means and the analog level reduction means for adding the second analog dither signal (B1) to the analog information signal (A1) and providing an analog information/dither signal (A1+B1);
(f) an analog to digital converter connected to the adder for translating the analog information/dither signal (A1+B1) into a digital information/dither signal (A2+B2) of n bits, where n is equal, or not equal, to m and greater than 1;
(g) a digital level reduction circuit connected to the digital dither generator for translating the first digital dither signal of m bits into a second digital dither signal (B2) of substantially l bits, the l bits of the second digital dither signal being composed of the l consecutive bits, including the most significant bit, of the first digital dither signal; and (h) a subtracter connected to both the analog to digital converter and the digital level reduction circuit for subtracting the second digital dither signal (B2) from the digital information/dither signal (A2+B2) and providing a digital information signal (A2).

2. The analog to digital conversion system of claim 1 wherein the analog level reduction means comprises a variable resistor.

3. The analog to digital conversion system of claim 1 wherein the second analog dither signal (B1) fed to the adder is of one or other of two opposite polarities.

4. The analog to digital conversion system of claim 1 further comprising:
 (a) an overload detector circuit connected to the subtracter for detecting the overloading of the analog to digital converter by the input analog information/dither signal (A1+B1); and
 (b) a limiter connected to both the subtracter and the overload detector circuit for limiting the magnitude of the digital information signal (A2) while the analog to digital converter is being overloaded by the analog information/dither signal (A1+B1).

5. The analog to digital conversion system of claim 4 wherein the analog to digital converter and the subtracter produces the outputs in the form of two's complement, and wherein the overload detector circuit comprises:
 (a) a positive overload detector circuit responsive to the two's complement output from the subtracter for detecting the positive overloading of the analog to digital converter; and
 (b) a negative overload detector circuit responsive to the two's complement output from the subtracter for detecting the negative overloading of the analog to digital converter.

6. The analog to digital conversion system of claim 4 wherein the analog to digital converter has a positive overload level (+L) and a negative overload level (−L) of the same absolute value, wherein the second analog dither signal (B1) is of negative polarity, and wherein the overload detector circuit comprises:
 (a) a positive overload detector circuit for detecting whether or not the magnitude of the digital information signal (A2) is up to a positive detection level (L1), the positive detection level (L1) being equal to the positive overload level (+L) of the analog to digital converter; and
 (b) a negative overload detector circuit for detecting whether or not the magnitude of the digital information signal (A2) is up to a negative detection level (L2), the negative detection level (L2) being higher than the negative overload level (−L) of the analog to digital converter approximately by the magnitude of the second dither signal (B1).

7. The analog to digital conversion system of claim 4 wherein the analog to digital converter has a positive overload level (+L) and a negative overload level (−L) of the same absolute value, wherein the second analog dither signal B1 is of positive polarity, and wherein the overload detector circuit comprises:
 (a) a positive overload detector circuit for detecting whether or not the magnitude of the digital information signal (A2) is up to a positive detection level (L1), the positive detection level (L1) being lower than the positive overload level (+L) of the analog to digital converter approximately by the magnitude of the digital dither signal (B1); and
 (b) a negative overload detector circuit for detecting whether or not the magnitude of the digital information signal (A2) is up to a negative detection level (L2), the negative detection level (L1) being equal to the negative overload level (−L) of the analog to digital converter.

8. The analog to digital conversion system of claim 4 further comprising a warning device connected to the overload detector circuit for giving a warning when the analog to digital converter is overloaded.

* * * * *